(12) United States Patent
Cheng et al.

(10) Patent No.: US 12,356,763 B2
(45) Date of Patent: Jul. 8, 2025

(54) SEMICONDUCTOR STRUCTURES AND MANUFACTURING METHODS THEREOF

(71) Applicant: ENKRIS SEMICONDUCTOR, INC., Jiangsu (CN)

(72) Inventors: Kai Cheng, Jiangsu (CN); Liyang Zhang, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 653 days.

(21) Appl. No.: 17/772,414

(22) PCT Filed: Apr. 15, 2021

(86) PCT No.: PCT/CN2021/087492
§ 371 (c)(1),
(2) Date: Apr. 27, 2022

(87) PCT Pub. No.: WO2022/217541
PCT Pub. Date: Oct. 20, 2022

(65) Prior Publication Data
US 2023/0290905 A1 Sep. 14, 2023

(51) Int. Cl.
*H10H 20/825* (2025.01)
*H10D 30/01* (2025.01)
(Continued)

(52) U.S. Cl.
CPC ........ *H10H 20/825* (2025.01); *H10D 30/015* (2025.01); *H10D 30/475* (2025.01);
(Continued)

(58) Field of Classification Search
CPC .......... H01L 21/0254; H01L 21/02639; H01L 21/20; H10H 20/01335; H10H 20/825;
(Continued)

(56) References Cited

U.S. PATENT DOCUMENTS 6,177,688 B1 * 1/2001 Linthicum ............ C30B 29/406
257/190
9,922,826 B2 3/2018 Dasgupta et al.
(Continued)

FOREIGN PATENT DOCUMENTS

CN 103681795 A 3/2014
CN 103681795 B * 3/2017 ....... H01L 21/02636
(Continued)

OTHER PUBLICATIONS

ISA State Intellectual Property Office of the People's Republic of China, International Search Report Issued in Application No. PCT/CN2021/087492, Dec. 27, 2021, WIPO, 4 pages.
(Continued)

*Primary Examiner* — Telly D Green
(74) *Attorney, Agent, or Firm* — The Small Patent Law Group LLC; Christopher R. Carroll

(57) ABSTRACT

A semiconductor structure and a manufacturing method thereof are provided. The semiconductor structure may include: a first epitaxial layer disposed on a substrate; a bonding layer disposed on the first epitaxial layer (where the bonding layer is provided with a first through-hole to expose the first epitaxial layer); a silicon substrate disposed on a side of the bonding layer away from the first epitaxial layer (where the first epitaxial layer is bonded to the silicon substrate by the bonding layer, the silicon substrate is provided with a through-silicon-via, and the through-silicon-via communicates with the first through-hole); a silicon device disposed on the silicon substrate; and a second epitaxial layer disposed on the first epitaxial layer exposed by the first through-hole. The present disclosure can improve the quality of the second epitaxial layer, and realize the integration of a silicon device and a III-V semiconductor device.

12 Claims, 3 Drawing Sheets

(51) Int. Cl.
*H10D 30/47* (2025.01)
*H10D 62/85* (2025.01)
*H10H 20/01* (2025.01)
*H10H 20/817* (2025.01)
*H10H 20/857* (2025.01)

(52) U.S. Cl.
CPC .. *H10D 62/8503* (2025.01); *H10H 20/01335* (2025.01); *H10H 20/817* (2025.01); *H10H 20/857* (2025.01); H10H 20/0364 (2025.01)

(58) Field of Classification Search
CPC ............... H10H 20/857; H10H 20/018; H10H 20/8142; H10H 20/8215; H10H 20/84; H10H 29/10; H10H 20/0364; H10H 20/817; H10D 62/8503; H10D 84/08; H10D 84/82; H10D 10/056; H10D 30/015; H10D 30/0218; H10D 30/0415; H10D 30/475; H10D 30/6738; H10D 62/113; H10D 8/051; H10D 8/60; H10D 84/8316
See application file for complete search history.

(56) References Cited

U.S. PATENT DOCUMENTS

| | | | | |
|---|---|---|---|---|
| 10,014,292 | B2 * | 7/2018 | Or-Bach | H01L 23/552 |
| 10,297,586 | B2 * | 5/2019 | Or-Bach | H01L 21/76254 |
| 10,643,836 | B2 * | 5/2020 | Lin | H10D 88/00 |
| 10,658,358 | B2 * | 5/2020 | Or-Bach | H01L 27/0688 |
| 10,840,222 | B2 * | 11/2020 | Or-Bach | H01L 27/092 |
| 2008/0099785 | A1 | 5/2008 | Bai et al. | |
| 2009/0159972 | A1 | 6/2009 | Jakschik et al. | |
| 2014/0349427 | A1 | 11/2014 | El-Ghoroury et al. | |
| 2017/0207214 | A1 * | 7/2017 | Or-Bach | H01L 21/823842 |
| 2017/0352532 | A1 | 12/2017 | Dasgupta et al. | |
| 2018/0277530 | A1 * | 9/2018 | Or-Bach | H01L 21/304 |
| 2019/0172826 | A1 * | 6/2019 | Or-Bach | H01L 27/0688 |
| 2020/0243487 | A1 * | 7/2020 | Or-Bach | H01L 23/552 |
| 2020/0266051 | A1 * | 8/2020 | Lin | H01L 27/0688 |

FOREIGN PATENT DOCUMENTS

| | | | | |
|---|---|---|---|---|
| CN | 107004670 A | | 8/2017 | |
| CN | 107195627 A | | 9/2017 | |
| CN | 104838498 B | * | 10/2018 | ......... H01L 29/0603 |

OTHER PUBLICATIONS

ISA State Intellectual Property Office of the People's Republic of China, Written Opinion of the International Searching Authority Issued in Application No. PCT/CN2021/087492, Dec. 27, 2021, WIPO, 5 pages.(Submitted with Machine/Partial Translation).

* cited by examiner

SEMICONDUCTOR STRUCTURES AND MANUFACTURING METHODS THEREOF

CROSS-REFERENCE TO RELATED APPLICATIONS

This application is a national stage entry of International Patent Application No. PCT/CN2021/087492 (filed 15 Apr. 2021), the entire disclosure of which is incorporated herein by reference.

TECHNICAL FIELD

The present disclosure relates to the field of semiconductor technologies, and to a semiconductor structure and a manufacturing method thereof.

BACKGROUND

With the development of science and technology, a semiconductor device has attracted more and more attention.

To further improve the performance and integration of the semiconductor device, a silicon device and a GaN device are often integrated on the same silicon substrate to superimpose the advantages of the silicon device and the GaN device. In the integration process, the GaN device is grown on a silicon substrate by a monolithic heteroepitaxy technique. However, the high dislocation density in the GaN device grown on the silicon substrate reduces the quality of the GaN device.

Since there is no good solution for the above problem, the development of the semiconductor device and the integration technology thereof is greatly limited.

SUMMARY

The present disclosure aims to provide a semiconductor structure and a manufacturing method thereof to improve quality of a second epitaxial layer.

According to an aspect of the present disclosure, a semiconductor structure is provided, and the semiconductor structure includes:
  a first epitaxial layer disposed on a substrate;
  a bonding layer disposed on the first epitaxial layer, wherein the bonding layer is provided with a first through-hole to expose the first epitaxial layer;
  a silicon substrate disposed on a side of the bonding layer away from the first epitaxial layer (where the first epitaxial layer is bonded to the silicon substrate by the bonding layer, the silicon substrate is provided with a through-silicon-via, and the through-silicon-via communicates with the first through-hole);
  a silicon device disposed on the silicon substrate; and
  a second epitaxial layer disposed on the first epitaxial layer exposed by the first through-hole.

Further, the first through-hole and the through-silicon-via are fully filled with the second epitaxial layer, a III-V semiconductor device is formed on the second epitaxial layer, and the second epitaxial layer is a part of the III-V semiconductor device.

Further, the III-V semiconductor device is a light emitting diode (LED) or high electron mobility transistor (HEMT).

Further, the III-V semiconductor device is electrically connected to the silicon device through a metal interconnection member.

Further, the silicon through-hole has a depth to width ratio greater than 4.

Further, the silicon substrate includes single crystal silicon with <100> orientation.

Further, the first epitaxial layer and the second epitaxial layer have the same material system which includes at least one of GaN, AlN, AlGaN, InGaN, or AlInGaN.

Further, the semiconductor structure further includes:
  a first dielectric layer disposed on a side of the silicon substrate away from the bonding layer. The first dielectric layer is provided with a second through-hole communicating with the through-silicon-via. The second epitaxial layer fully fills the first through-hole, the through-silicon-via, and the second through-hole, and protrudes from the second through-hole.

Further, a sidewall of the through-silicon-via has a second dielectric layer.

According to an aspect of the present disclosure, a manufacturing method of a semiconductor structure is provided. The manufacturing method includes:
  providing a first epitaxial layer and a silicon substrate (where the first epitaxial layer is disposed on a substrate);
  bonding the first epitaxial layer and the silicon substrate by a bonding layer;
  forming a through-silicon-via in the silicon substrate;
  forming a first through-hole in the bonding layer to expose the first epitaxial layer (where the first through-hole communicates with the through-silicon-via);
  forming a silicon device on the silicon substrate; and
  forming a second epitaxial layer on the first epitaxial layer exposed by the first through-hole.

Further, the manufacturing method further includes:
  forming a III-V semiconductor device on the second epitaxial layer (where the second epitaxial layer is a part of the III-V semiconductor device).

Further, the manufacturing method further includes:
  forming a metal interconnect member to electrically connect the III-V semiconductor device to the silicon device.

Further, the through-silicon-via has a depth to width ratio greater than 4.

Further, before forming the second epitaxial layer on the first epitaxial layer exposed by the first through-hole, the manufacturing method further includes:
  forming a first dielectric layer on a side of the silicon substrate away from the bonding layer (where the first dielectric layer is provided with a second through-hole communicating with the through-silicon-via, the second epitaxial layer fully fills the first through-hole, the through-silicon-via and the second through-hole and protrudes from the second through-hole, and a part of the second epitaxial layer protruding from the second through-hole is disposed on the first dielectric layer).

Further, the silicon device is formed on the silicon substrate before the silicon substrate is bonded to the first epitaxial layer; or
  the silicon device is formed on the silicon substrate after the silicon substrate is bonded to the first epitaxial layer and before the through-silicon-via is formed on the silicon substrate; or
  the silicon device is formed on the silicon substrate after the silicon substrate is bonded to the first epitaxial layer, after the through-silicon-via are formed on the silicon substrate, and before or after the second epitaxial layer is formed on the first epitaxial layer.

In the semiconductor structure and the manufacturing method thereof according to the present disclosure, the silicon substrate is bonded on the first epitaxial layer. On the one hand, because a thickness of the silicon substrate is relatively thick, the depth to width ratio of the through-silicon-via formed therein is generally larger. When the first epitaxial layer is epitaxially grown to form the second epitaxial layer, a dislocation in the second epitaxial layer is bent, and the dislocation is annihilated in the sidewall of the through-silicon-via, thereby the second epitaxial layer with a small dislocation density is formed to improve the quality of the second epitaxial layer. On the other hand, a silicon device is formed on the silicon substrate to facilitate the integration of III-V semiconductor and silicon device. In an optional embodiment, a III-V semiconductor device is formed on the second epitaxial layer, thereby the integration of the silicon device and the III-V semiconductor device is achieved.

Figure 1:
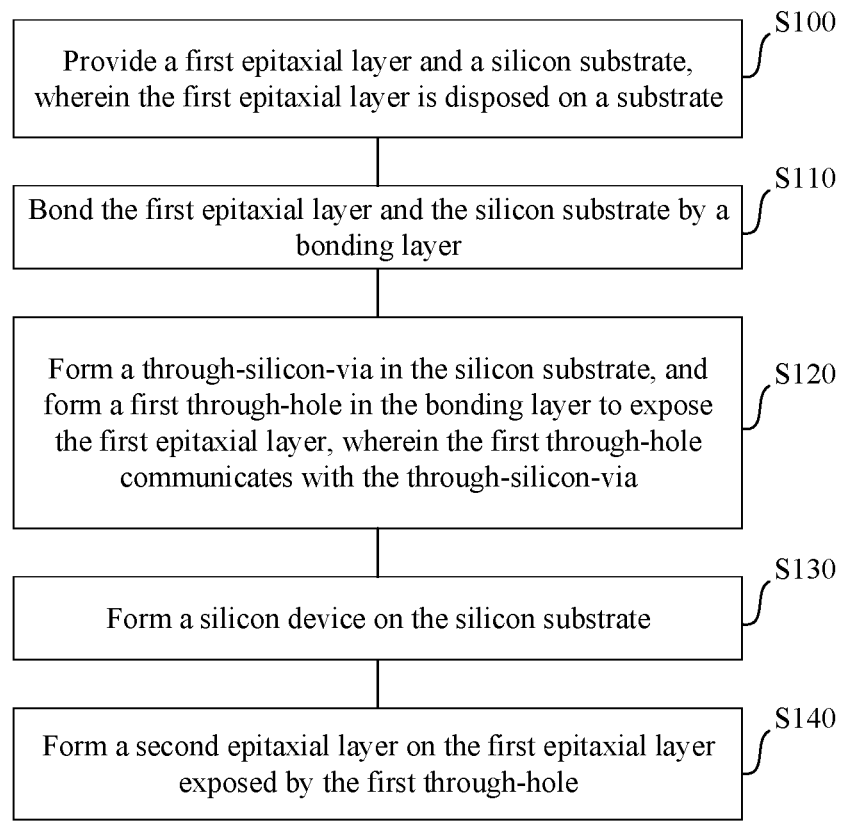
FIG. 1 is a flowchart illustrating a manufacturing method of a semiconductor structure according to embodiment 1 of the present disclosure.

List of reference numerals: first epitaxial layer 1; bonding layer 2; first through-hole 201; silicon substrate 3; through-silicon-via 301; silicon device 4; second epitaxial layer 5; substrate 6; first dielectric layer 7; second through-hole 701; metal interconnect member 8; dielectric layer 9; second dielectric layer 10; III-V semiconductor device 11.

DETAILED DESCRIPTION OF THE EMBODIMENTS

Exemplary embodiments will be described in detail herein, examples of which are represented in the drawings. Where the following description relates to the accompanying drawings, the same numerals in the different drawings indicate the same or similar elements unless otherwise indicated. The embodiments described in the following exemplary embodiments do not represent all embodiments that are consistent with the present disclosure. Rather, they are only examples of devices that are consistent with some aspects of the present disclosure, as detailed in the appended claims.

Embodiment 1

Embodiment 1 of the present disclosure provides a semiconductor structure and a manufacturing method of a semiconductor structure. As shown in FIG. 1, the manufacturing method of a semiconductor structure of the embodiment 1 may include steps S100 to S140.

At step S100, a first epitaxial layer and a silicon substrate are provided, where the first epitaxial layer is disposed on a substrate.

At step S110, the first epitaxial layer and the silicon substrate are bonded by a bonding layer.

At step S120, a through-silicon-via is formed in the silicon substrate, and a first through-hole is formed in the bonding layer to expose the first epitaxial layer, where the first through-hole communicates with the through-silicon-via.

At step S130, a silicon device is formed on the silicon substrate.

At step S140, a second epitaxial layer is formed on the first epitaxial layer exposed by the first through-hole.

Figure 3:
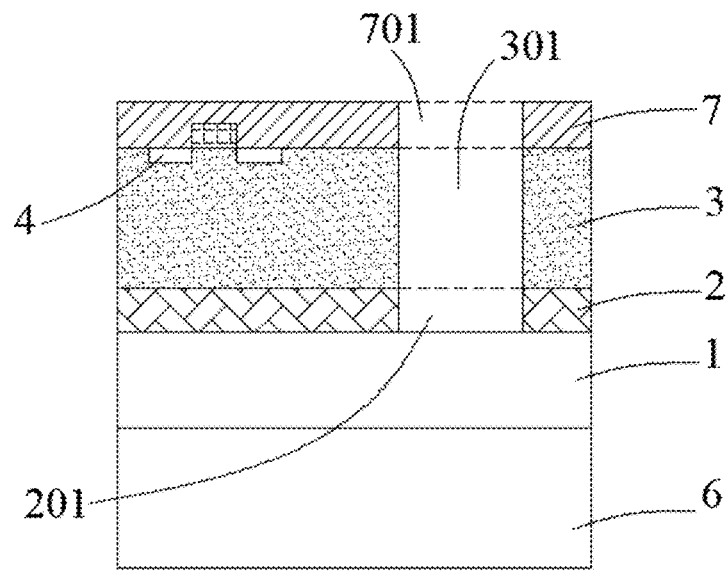
FIG. 3 is a schematic diagram illustrating a structure after forming a first dielectric layer in the manufacturing method of the semiconductor structure according to embodiment 1 of the present disclosure.
Figure 4:
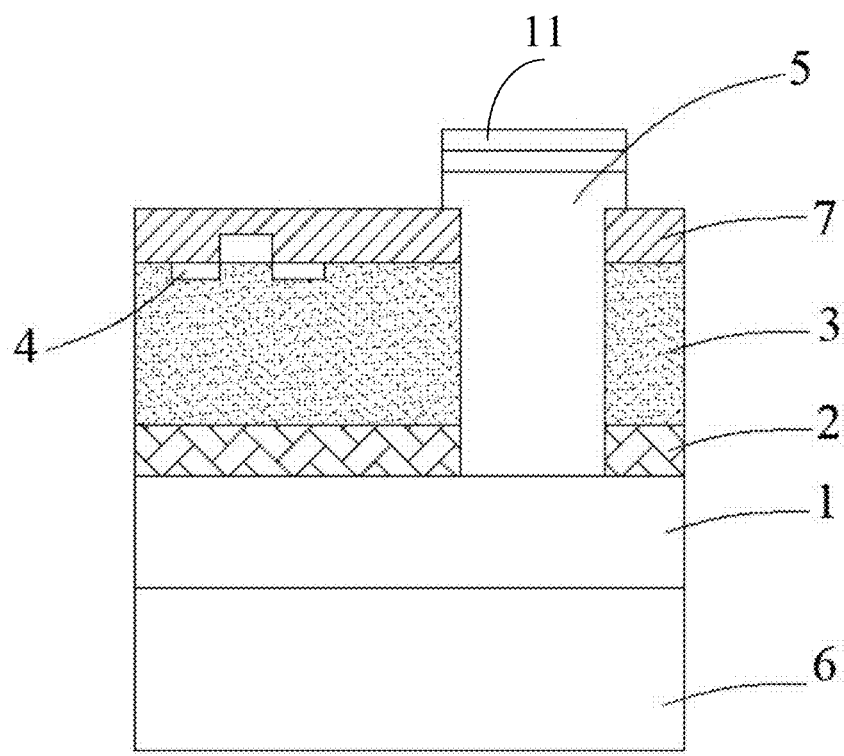
FIG. 4 is a schematic diagram illustrating a structure after forming a second epitaxial layer in the manufacturing method of the semiconductor structure according to embodiment 1 of the present disclosure.

In the manufacturing method of the semiconductor structure provided by embodiment 1, as shown in FIGS. 3 and 4, the silicon substrate 3 is bonded on the first epitaxial layer 1. On the one hand, because a thickness of the silicon substrate 3 is relatively thick, the depth to width ratio of the through-silicon-via 301 formed therein is generally better. When the first epitaxial layer 1 is epitaxially grown to form the second epitaxial layer 5, a dislocation in the second epitaxial layer 5 is bent, and the dislocation is annihilated in an inside or sidewall of the through-silicon-via 301, thereby the second epitaxial layer 5 with a small dislocation density is formed to improve the quality of the second epitaxial layer 5. On the other hand, a silicon device 4 is formed on the silicon substrate 3 to facilitate the integration of III-V semiconductor devices and silicon device 4.

The steps of embodiment 1 are described in detail below.

At step S100, the first epitaxial layer and the silicon substrate are provided, and the first epitaxial layer is disposed on a substrate.

Figure 2:
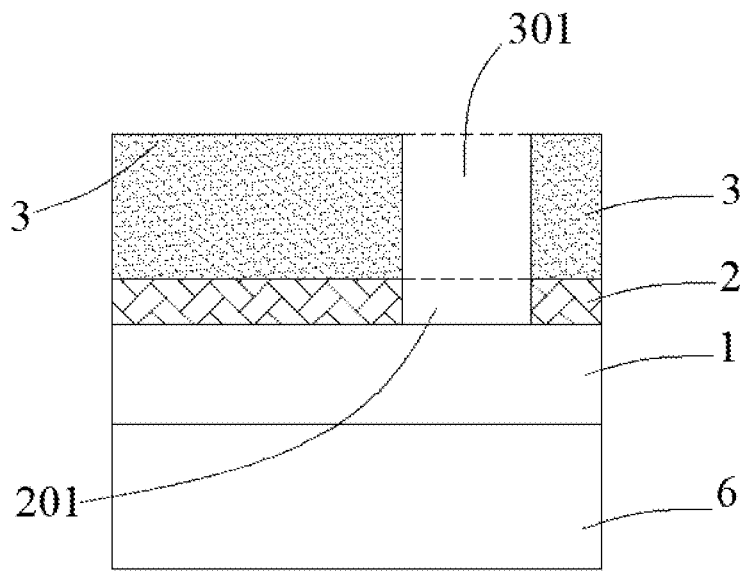
FIG. 2 is a schematic diagram illustrating a structure after completing of step 120 in the manufacturing method of the semiconductor structure according to embodiment 1 of the present disclosure.

As shown in FIG. 2, the material of the first epitaxial layer 1 may include at least one of GaN, AlN, AlGaN, InGaN or AlInGaN. The silicon substrate 3 may be single crystal silicon with <100> orientation, but examples of the present disclosure do not specifically limit the type of the silicon substrate 3. The first epitaxial layer 1 is located on the substrate 6. The substrate 6 may be a silicon substrate, a silicon carbide substrate, a sapphire substrate, or a Silicon-On-Insulator (SOI) substrate, but not limited thereto, and may also be a GaN substrate.

At step S110, the first epitaxial layer and the silicon substrate are bonded by the bonding layer.

As shown in FIG. 2, the material of the bonding layer 2 may be silicon dioxide, or a silicon nitride, but not limited thereto, and may also be metal, etc. The thickness of the bonding layer 2 may be 0.01 μm~2 μm. With a thicker bonding layer 2, the depth to width ratio of the through-silicon-via 301 can be increased, to further improve the chance of dislocation annihilation. In an embodiment of the present disclosure, step S110 may include: forming the bonding layer 2 in the first epitaxial layer 1 or the silicon substrate 3, where the bonding layer 2 is used as a contact layer to bond the first epitaxial layer 1 and the silicon substrate 3 together. In this case, the bonding layer 2 may be formed in only one of the first epitaxial layer 1 and the silicon substrate 3. That is, the bonding layer 2 is formed in one of the first epitaxial layer 1 and the silicon substrate 3, and no bonding layer 2 is formed in the other of the first epitaxial layer 1 and the silicon substrate 3.

In another example of the present disclosure, step S110 may include: forming a first bonding layer on a surface of the first epitaxial layer 1; forming a second bonding layer on a surface of the silicon substrate 3; and bonding the first epitaxial layer 1 and the silicon substrate 3 together by using the first bonding layer and the second bonding layer as contact layers. In this case, the first bonding layer and the second bonding layer can both be prepared by a deposition process, but the embodiments of the present disclosure are not limited to this. The first bonding layer and the second bonding layer are in contact with each other to form the bonding layer 2 described above.

In a yet another example of the present disclosure, the bonding layer 2 may also be provided separately (i.e., the bonding layer 2 is not formed in any of the first epitaxial layer 1 and the silicon substrate 3).

At step S120, a through-silicon-via is formed in the silicon substrate, a first through-hole is formed in the bonding layer to expose the first epitaxial layer, and the first through-hole communicates with the through-silicon-via.

As shown in FIG. 2, the through-silicon-via 301 may be formed by a patterning process, such as a photolithography process, etc. The through-silicon-via 301 penetrates through the silicon substrate 3 in the direction of the thickness of the silicon substrate 3. The through-silicon-via 301 may be a circular via, an orthogonal polygonal via, or a shaped via, etc. The number of through-silicon-via(s) 301 may be one, two, three, or more. The through-silicon-via 301 may have a depth to width ratio greater than 4.

As shown in FIG. 2, the first through-hole 201 may be formed by a patterning process, such as a photolithography process, etc. The first through-hole 201 penetrates through the bonding layer 2 in the direction of the thickness of the bonding layer 2. The first through-hole 201 may be a circular hole, a polygonal hole, an irregular polygonal hole, an irregular hole, etc. The number of the first through-hole(s) 201 may be one, two, three or more.

As shown in FIG. 2, the through-silicon-via communicates with the first through-hole. In the case of a plurality of through-silicon-vias and a plurality of first through-holes, the plurality of through-silicon-vias communicates with the plurality of first through-holes in a one-to-one correspondence. Each of the through-silicon-vias may have the same shape as the corresponding first through-hole. Each of the through-silicon-vias may have the same size as the corresponding first through-hole. Each of the through-silicon-vias may have an orthographic projection on the first epitaxial layer that exactly coincides with an orthographic projection of the corresponding first through-hole on the first epitaxial layer. In this case, each of the through-silicon-vias and the corresponding first through-hole may be formed by a single patterning process, but this is not specifically limited by the embodiments of the present disclosure.

At step S130, the silicon device is formed on the silicon substrate.

As shown in FIG. 3, the silicon device 4 may be a PMOS, NMOS, CMOS, etc. The silicon device 4 may be prepared by a deposition process. The silicon device 4 may be formed on the silicon substrate 3 before the silicon substrate 3 is bonded to the first epitaxial layer 1, or the silicon device 4 may be formed on the silicon substrate 3 after the silicon substrate 3 is bonded to the first epitaxial layer 1. Furthermore, the silicon device 4 may be formed on the silicon substrate 3 before the through-silicon-via 301 is formed on the silicon substrate 3, or the silicon device 4 may be formed on the silicon substrate 3 after the through-silicon-via 301 is formed on the silicon substrate 3.

After the silicon device 4 is formed, the manufacturing method of the semiconductor structure of the embodiment 1 of the present disclosure may further include: forming a first dielectric layer 7 on a side of the silicon substrate 3 away from the bonding layer 2. A material of the first dielectric layer 7 may be silicon dioxide or silicon nitride, etc. The first dielectric layer 7 may be provided with a second through-hole 701 which communicates with the through-silicon-via 301. The second through-hole 701 may be formed by a patterning process, such as a photolithography process, etc. The second through-hole 701 penetrates through the first dielectric layer 7 in the direction of the thickness of the first dielectric layer 7. The second through-hole 701 may be a circular hole, a polygonal hole, or an irregular hole, etc. The number of the second through-hole(s) 701 may be one, two, three, or more. In this case, a plurality of second through-holes 701 communicates with a plurality of through-silicon-vias 301 in a one-to-one correspondence. Each of the through-silicon vias 301 may have an orthographic projection on the first epitaxial layer 1 that exactly coincides with an orthographic projection of the corresponding second through 701 on the first epitaxial layer 1. The first through-hole 201, the through-silicon-via 301, and the second through-hole 701 may be prepared by a single patterning process, but the embodiments of the present disclosure are not limited thereto.

At step S140, the second epitaxial layer is formed on the first epitaxial layer exposed by the first via hole.

As shown in FIG. 4, a material of the second epitaxial layer 5 may include at least one of GaN, AlN, AlGaN, InGaN, or AlInGaN. The material of the second epitaxial layer 5 may be the same as the material of the first epitaxial layer 1 or may be different from the material of the first epitaxial layer 1. In addition, the second epitaxial layer 5 may also be doped with Si ions, Ge ions, Sn ions, Se ions, Te ions, Mg ions, Zn ions, Ca ions, Sr ions, or Ba ions. Optionally, the second epitaxial layer 5 may include a plurality of epitaxial sub-layers arranged in a stack, the ions doped in each of the epitaxial sub-layers may be the same, or may be different. In addition, the conductivity types of various epitaxial sub-layers doped with ions may be the same or different. The first through-hole 201 and the through-silicon-via 301 may be fully filled with the second epitaxial layer 5. In this case, the dislocations growing in the second epitaxial layer 5 in the through-silicon-via 301 can be cut off at the inside or sidewall of the through-silicon-via 301 due to the depth to width ratio of the through-silicon-via 301 being greater than 4, thereby the quality of the second epitaxial layer 5 is improved. Further, for example, a first dielectric layer 7 may be formed on the silicon substrate 3, the second epitaxial layer 5 fully fills the first through-hole 201, the through-silicon-via 301, and the second through-hole 701 and protrudes from the second through-hole 701, and a part of the second epitaxial layer 5 protruding from the second through-hole 701 is disposed on the first dielectric layer 7.

A semiconductor structure of the embodiment 1 of the present disclosure may be manufactured by the manufacturing method of the semiconductor structure described above. As shown in FIGS. 2 to 4, the semiconductor structure may include the first epitaxial layer 1, the bonding layer 2, the silicon substrate 3, the silicon device 4, and a second epitaxial layer 5.

The bonding layer 2 is disposed on the first epitaxial layer 1 and is provided with a first through-hole 201 to expose the first epitaxial layer 1. The silicon substrate 3 is disposed on a side of the bonding layer 2 away from the first epitaxial layer 1, and the first epitaxial layer 1 is bonded to the silicon substrate 3 by the bonding layer 2. The silicon substrate 3 is provided with a through-silicon-via 301, which may communicate with the first through-hole 201. The silicon device 4 may be disposed on the silicon substrate 3. The second epitaxial layer 5 is disposed on the first epitaxial layer 1 exposed by the first through 201.

As shown in FIGS. 2 to 4, the material of the first epitaxial layer 1 may include at least one of GaN, AlN, AlGaN, InGaN, or AlInGaN. The silicon substrate 3 may be single crystal silicon with <100> orientation, but this is not specifically limited by the present disclosure. The material of the bonding layer 2 may be silicon dioxide or silicon nitride, etc. The material of the second epitaxial layer 5 may include at least one of GaN, AlN, AlGaN, InGaN, or AlInGaN. The material of the second epitaxial layer 5 may be the same as the material of the first epitaxial layer 1, or may be different from the material of the first epitaxial layer 1. The second epitaxial layer 5 may fully fill the first through-hole 201 and the through-silicon-via 301. The silicon device 4 may be PMOS, NMOS, CMOS, etc.

As shown in FIGS. 2 to 4, the through-silicon-via 301 penetrates through the silicon substrate 3 in the direction of the thickness of the silicon substrate 3. The through-silicon-via 301 may be a circular via, an orthogonal polygonal via, a shaped via, etc. The number of the through-silicon-via(s) 301 may be one, two, three or more. The first through-hole 201 penetrates through the bonding layer 2 in the direction of the thickness of the bonding layer 2. The first through-hole 201 may be a circular hole, a polygonal hole, or an irregular hole, etc. The number of the first through-hole(s) 201 may be one, two, three, or more.

As shown in FIGS. 2 to 4, the through-silicon-via 301 communicates with the first through-hole 201. In the case of a plurality of through-silicon-vias 301 and a plurality of first through-holes 201, the plurality of through-silicon-vias 301 communicates with the plurality of first through-holes 201 in a one-to-one correspondence. Each of the through-silicon-vias 301 may have the same shape as the corresponding first through-hole 201. Each of the through-silicon-vias 301 may have the same size as the corresponding first through-hole 201. Each of the through-silicon-vias 301 may have an orthographic projection on the first epitaxial layer 1 that exactly coincides with an orthographic projection of the corresponding first through-hole 201 on the first epitaxial layer 1.

As shown in FIGS. 2 to 4, the semiconductor structure may further include a first dielectric layer 7. The first dielectric layer 7 may be disposed on a side of the silicon substrate 3 away from the bonding layer 2 and is provided with a second through-hole 701 which communicates with the through-silicon-via 301. The second epitaxial layer 5 fully fills the first through-hole 201, the through-silicon-via 301, and the second through-hole 701 and protrudes from the second through-hole 701, and a part of the second epitaxial layer 5 protruding from the second through-hole 701 is disposed on the first dielectric layer 7. A material of the first dielectric layer 7 may be silicon dioxide, silicon nitride, etc. The first dielectric layer 7 may be provided with the second through-hole 701 which communicates with the through-silicon-via 301. The second through-hole 701 penetrates through the first dielectric layer 7 in the direction of the thickness of the first dielectric layer 7. The second through-hole 701 may be a circular hole, a polygonal hole, an irregular hole, etc. The number of the second through-hole(s) 701 may be one, two, three, or more. In this case, a plurality of second through-holes 701 communicates with a plurality of through-silicon-vias 301 in a one-to-one correspondence. Each of the through-silicon vias 301 may have an orthographic projection on the first epitaxial layer 1 that exactly coincides with an orthographic projection of the corresponding second through 701 on the first epitaxial layer 1.

The manufacturing method of the semiconductor structure and the semiconductor structure provided by the embodiment 1 of the present disclosure belong to the same inventive concept, and the description of the relevant details and beneficial effects can be referred to each other without further elaboration.

Embodiment 2

A semiconductor structure and a manufacturing method of the semiconductor structure of the embodiment 2 of the present disclosure are substantially the same as that of the embodiment 1 of the present disclosure, the difference between the embodiment 1 and the embodiment 2 is merely in that a III-V semiconductor device is formed on the second epitaxial layer in the embodiment 2. The III-V semiconductor device may include a first conductive type semiconductor layer, a light emitting layer, and a second conductive type semiconductor layer from bottom to top. The first conductive type semiconductor layer may be disposed on the second epitaxial layer, and the light emitting layer may be disposed on a side of the first conductive type semiconductor layer away from the second epitaxial layer. The light emitting layer may be at least one of a single quantum well structure, a multiple quantum well (MQW) structure, a quantum line structure, or a quantum dot structure. In the case where the light emitting layer is the multiple quantum well structure, the light emitting layer may include alternately provided potential well layers and potential barrier layers. The first conductive type is different from the second conductive type. The first conductive type semiconductor layer may be a P-type semiconductor layer, and the second conductive type semiconductor layer may be a N-type semiconductor layer, but the disclosure does not make special limitations on this. Materials of the potential well layer, the potential barrier layer, the first conductive type semiconductor layer, and the second conductive type semiconductor layer may be III-V semiconductor materials, but the disclosure does not make special limitations on this. For example, the material of the potential well layer is InGaN, the material of the potential barrier layer is GaN, the material of the first conductive type semiconductor layer is GaN, and the material of the second conductive type semiconductor layer is GaN. The second epitaxial layer may be a part of the III-V semiconductor device, but the second epitaxial layer may not be a part of a III-V semiconductor device. The III-V semiconductor device may be an LED or a HEMT but is not limited to this, and may also be a radio frequency diode, etc. For example, the III-V semiconductor device may be LED and the III-V semiconductor device may also include a reflector layer, such that the III-V semiconductor device is a resonant cavity light emitting diode (RCLED).

Embodiment 3

Figure 5:
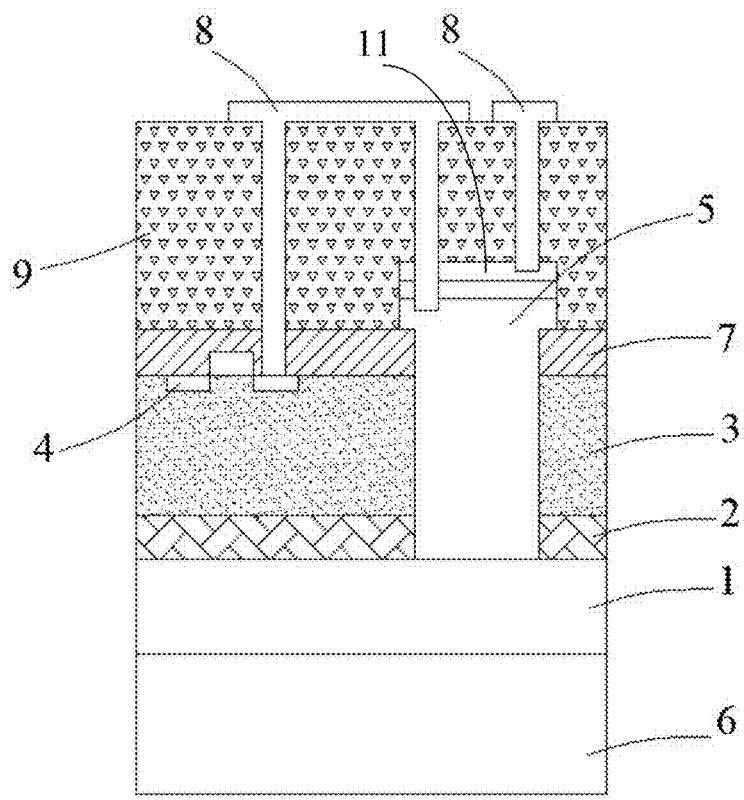
FIG. 5 is a schematic diagram illustrating a semiconductor structure according to embodiment 3 of the present disclosure.

A semiconductor structure and a manufacturing method of the semiconductor structure of the embodiment 3 of the present disclosure are substantially the same as that of the embodiment 2 of the present disclosure, the difference between the embodiment 2 and the embodiment 3 is merely in that the III-V semiconductor device is electrically connected to the silicon device 4 through a metal interconnect structure 8 as shown in FIG. 5. The semiconductor structure may also include a dielectric layer 9 covering the first dielectric layer 7 and the III-V semiconductor device. Furthermore, the III-V semiconductor device may be electrically connected to other devices through the metal interconnection member 8.

Embodiment 4

Figure 6:
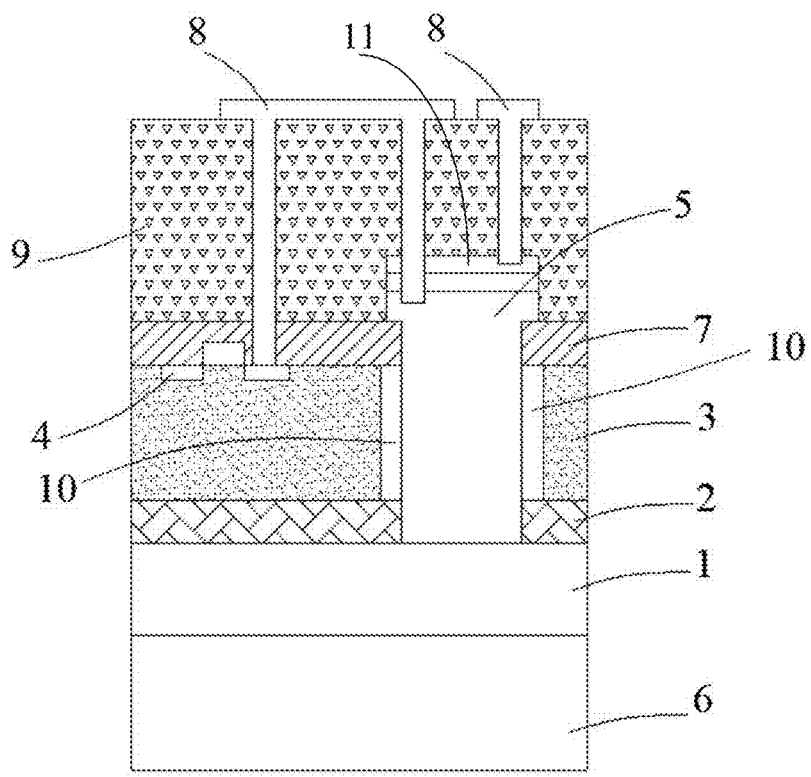
FIG. 6 is a schematic diagram illustrating a semiconductor structure according to embodiment 4 of the present disclosure.

A semiconductor structure and a manufacturing method of the semiconductor structure of the embodiment 4 of the present disclosure are substantially the same as that of the embodiment 3 of the present disclosure, the difference between the embodiment 3 and the embodiment 4 is merely in that the sidewall of the through-silicon-via 301 has a second dielectric layer 10 as shown in FIGS. 3 and 6. A material of the second dielectric layer 10 may be silicon dioxide or silicon nitride. A formation step of the second dielectric layer 10 may be performed after the formation of the through-silicon-via 301. Examples of the present disclosure may form the second dielectric layer 10 by a thermal oxidation process, but of course, the second dielectric layer 10 may also be formed by other processes, such as a deposition process, etc. In the case of where the second dielectric layer 10 is formed by the thermal oxidation process, the above-mentioned step of forming the first through-hole 201 needs to be performed after the formation of the second dielectric layer 10. The sidewall of the through-silicon-via 301 of the embodiment 4 of the present disclosure has the second dielectric layer 10, which allows the second epitaxial layer 5 to be grown on the second dielectric layer 10 to improve the quality of the second epitaxial layer 5.

The above embodiments are only preferred embodiments of the present disclosure, and do not limit the present disclosure in any form. Although the present disclosure has been disclosed as above in the preferred embodiment, it is not intended to limit the present disclosure. Those skilled in the art, without departing from the scope of the technical solutions of the present disclosure, can make some changes or modifications to equivalent embodiments of equivalent changes by using the technical content disclosed above, in the case of where any content does not depart from the technical solutions of the present disclosure, any simple modifications and equivalent changes made to the above embodiments according to the technical essence of the present disclosure still fall within the scope of the technical solutions of the present disclosure.

The invention claimed is:

1. A semiconductor structure, comprising:
a first epitaxial layer disposed on a substrate;
a bonding layer disposed on the first epitaxial layer, wherein the bonding layer is provided with a first through-hole to expose the first epitaxial layer;
a silicon substrate disposed on a side of the bonding layer away from the first epitaxial layer, wherein the first epitaxial layer is bonded to the silicon substrate by the bonding layer, the silicon substrate is provided with a through-silicon-via, and the through-silicon-via communicates with the first through-hole;
a silicon device disposed on the silicon substrate; and
a second epitaxial layer disposed on the first epitaxial layer that is exposed by the first through-hole;
wherein the first through-hole and the through-silicon-via are fully filled with the second epitaxial layer, and a III-V semiconductor device is formed on the second epitaxial layer;
wherein the III-V semiconductor device is a light emitting diode (LED) or high electron mobility transistor (HEMT);
wherein the III-V semiconductor device is electrically connected to the silicon device through a metal interconnection member.

2. The semiconductor structure of claim 1, wherein the second epitaxial layer is a part of the III-V semiconductor device.

3. The semiconductor structure of claim 1, wherein the through-silicon-via has a depth to width ratio greater than 4.

4. The semiconductor structure of claim 1, wherein the silicon substrate comprises single crystal silicon with <100> orientation.

5. The semiconductor structure of claim 1, wherein the first epitaxial layer and the second epitaxial layer have the same material system which comprises at least one of GaN, AlN, AlGaN, InGaN, or AlInGaN.

6. The semiconductor structure of claim 1, further comprising:
a first dielectric layer disposed on a side of the silicon substrate away from the bonding layer, wherein the first dielectric layer is provided with a second through-hole communicating with the through-silicon-via, the second epitaxial layer fully fills the first through-hole, the through-silicon-via and the second through-hole and protrudes from the second through-hole.

7. The semiconductor structure of claim 1, wherein a sidewall of the through-silicon-via has a second dielectric layer.

8. A manufacturing method of a semiconductor structure, comprising:
providing a first epitaxial layer and a silicon substrate, wherein the first epitaxial layer is disposed on a substrate;
bonding the first epitaxial layer and the silicon substrate by a bonding layer;
forming a through-silicon-via in the silicon substrate;
forming a first through-hole in the bonding layer to expose the first epitaxial layer, wherein the first through-hole communicates with the through-silicon-via;
forming a silicon device on the silicon substrate;
forming a second epitaxial layer on the first epitaxial layer exposed by the first through-hole;
forming a III-V semiconductor device on the second epitaxial layer, wherein the III-V semiconductor device is a light emitting diode (LED) or high electron mobility transistor (HEMT); and
forming a metal interconnect member to electrically connect the III-V semiconductor device to the silicon device.

9. The manufacturing method of claim 8, wherein the second epitaxial layer is a part of the III-V semiconductor device.

10. The manufacturing method of claim 9, wherein the through-silicon-via has a depth to width ratio greater than 4.

11. The manufacturing method of claim 8, wherein before forming the second epitaxial layer on the first epitaxial layer exposed by the first through-hole, the manufacturing method further comprises:
forming a first dielectric layer on a side of the silicon substrate away from the bonding layer, wherein the first dielectric layer is provided with a second through-hole communicating with the through-silicon-via, the second epitaxial layer fully fills the first through-hole, the through-silicon-via and the second through-hole and protrudes from the second through-hole, and a part of the second epitaxial layer protruding from the second through-hole is disposed on the first dielectric layer.

12. The manufacturing method of claim 8, wherein the silicon device is formed on the silicon substrate before the silicon substrate is bonded to the first epitaxial layer; or the silicon device is formed on the silicon substrate after the silicon substrate is bonded to the first epitaxial layer and before the through-silicon-via is formed on the silicon substrate; or the silicon device is formed on the silicon substrate after the silicon substrate is bonded to the first epitaxial layer, after the through-silicon-via are formed on the silicon substrate, and before or after the second epitaxial layer is formed on the first epitaxial layer.

* * * * *